(12) United States Patent
Chu et al.

(10) Patent No.: US 7,589,474 B2
(45) Date of Patent: Sep. 15, 2009

(54) ION SOURCE WITH UPSTREAM INNER MAGNETIC POLE PIECE

(75) Inventors: Paul K. Chu, Kowloon (HK); Deli Tang, Chengdu (CN); Shihao Pu, Chengdu (CN); Honghui Tong, Chengdu (CN); Qingchuan Chen, Chengdu (CN)

(73) Assignee: City University of Hong Kong, Kowloon (HK)

( * ) Notice: Subject to any disclaimer, the term of this patent is extended or adjusted under 35 U.S.C. 154(b) by 421 days.

(21) Appl. No.: 11/567,333

(22) Filed: Dec. 6, 2006

(65) Prior Publication Data

US 2008/0136309 A1 Jun. 12, 2008

(51) Int. Cl.
*H05B 31/26* (2006.01)

(52) U.S. Cl. ............... 315/111.81; 315/111.91; 315/111.41; 315/111.21; 313/158; 313/153; 313/359.1; 313/362.1

(58) Field of Classification Search ............ 313/153, 313/154, 158, 161, 359.1, 362.1, 363.1, 618, 313/632; 315/111.21, 111.31, 111.41, 111.71, 315/111.81, 111.91, 501, 507
See application file for complete search history.

(56) References Cited

U.S. PATENT DOCUMENTS

| | | | |
|---|---|---|---|
| 4,481,062 A | 11/1984 | Kaufman et al. | |
| 4,862,032 A | 8/1989 | Kaufman et al. | |
| 5,359,258 A | 10/1994 | Arkhipov et al. | |
| 5,763,989 A | 6/1998 | Kaufman | |
| 5,973,447 A * | 10/1999 | Mahoney et al. | 313/359.1 |
| 6,448,721 B2 * | 9/2002 | Raitses et al. | 315/501 |
| 6,608,431 B1 | 8/2003 | Kaufman | |
| 6,645,301 B2 | 11/2003 | Sainty | |
| 6,750,600 B2 | 6/2004 | Kaufman et al. | |
| 6,984,942 B2 | 1/2006 | Siegfried et al. | |
| 7,116,054 B2 * | 10/2006 | Zhurin | 315/111.41 |
| 2002/0014845 A1 | 2/2002 | Raitses et al. | |
| 2005/0237000 A1 | 10/2005 | Zhurin | |
| 2005/0247885 A1 | 11/2005 | Madocks | |
| 2007/0026161 A1 * | 2/2007 | Madocks | 427/569 |

OTHER PUBLICATIONS

Zhurin, et al., "Physics of closed drift thrusters", Plasma Sources Sci. Technology, 1999, R1-R20, United Kingdom.

* cited by examiner

*Primary Examiner*—Haissa Philogene
(74) *Attorney, Agent, or Firm*—Stites & Harbison PLLC; Ross F. Hunt, Jr.; Douglas E. Jackson (57) ABSTRACT

A closed drift ion source is disclosed. The ion source has an open end 1 and a central axis 150 around which are arranged outer magnetic pole piece 3, inner magnetic pole piece 5, anode 2, shield 6 and back magnetic shunt 17. In one embodiment the anode 2 and inner magnetic pole piece 5 are annular. Permanent magnets 7 are located behind the shield 6 and in contact with outer magnetic pole piece 3 and the back magnetic shunt 17. As a result the magnetic field lines pass through the magnetic pole pieces and a mirror magnetic field is set up in the discharge region between them. The inner magnetic pole piece 5 is hollow which facilitates production of the mirror magnetic field.

21 Claims, 7 Drawing Sheets

ION SOURCE WITH UPSTREAM INNER MAGNETIC POLE PIECE

FIELD OF THE INVENTION

The present invention relates to an ion source. Some embodiments relate to ion beam sources and to closed drift hall ion thrusters. The present invention may be applied to a cold cathode hall-type ion source used for surface treatment with wide and high current ion beams.

BACKGROUND OF THE INVENTION

An ion source is a device that emits ions from a plasma and preferably forms ion beams. The ion beams can be used for various technological applications such as cleaning, activation, polishing, etching, thin film deposition, or ion thruster.

The energetic beams of ions can be emitted by applying electrostatic and electromagnetic acceleration methods. An example of an electrostatic acceleration ion source, the so-called Kaufman ion source, also known as a Kaufman ion thruster or electron bombardment ion source, is described in U.S. Pat. No. 4,481,062 issued to H. R. Kaufman in 1984, which is incorporated herein by reference. A disadvantage of such an ion source is that it requires the use of ion accelerating grids and has a low intensity ion beam.

A hall type ion source, in which the electromagnetic acceleration is used, was introduced by Kaufman in 1989 in U.S. Pat. No. 4,862,032. Some modified sources are also described in U.S. Pat. No. 6,608,431 B1 and U.S. Pat. No. 6,750,600 B2 by Kaufman, and in U.S. Pat. No. 6,645,301 B2 by Sainty. These are gridless ion sources with a discharge chamber determined by the conical shape of a hollow anode and therefore also called end-hall ion sources with a circular discharge region and only an outside open boundary. The ion beams are generated and accelerated continuously over the circular cross section in crossed electric and magnetic fields, whose density is several hundred times higher than that offered by electrostatic acceleration due to the presence of electrons to avoid the disruptive mutual repulsion of positive ions. These publications are also incorporated herein by reference.

Electromagnetic acceleration ion sources, which are referred to as gridless ion sources, include two common types, which are both also called hall ion sources. One is the aforementioned end hall ion source and the other is a closed drift ion source with an annular discharge channel. Both of these ion sources utilize the hall effect which plays a major role in plasma discharge and ion acceleration.

Closed drift ion sources have been known since Russian ion thrusters for satellite propulsion were reported in 1960's. There are two main types of closed drift ion source distinguished by the length and materials of the discharge channel, namely the magnetic layer ion source and the anode layer ion source. The first one has a long discharge channel, which is usually made of dielectric materials, whereas the second one has a short discharge channel and its wall is made of conductive materials. Both of them have very similar characteristics and performance, but with some non-fundamental differences. They usually have radial magnetic field shape as shown in U.S. Pat. No. 5,359,258 by Arkhipov and U.S. Pat. No. 5,763,989 by Kaufman, and as described by Zhurin, in *Plasma Source Science and Technolog*, Vol. 8 (1999), beginning on page R1. These publications are also incorporated herein by reference.

Anode layer ion sources produce and accelerate ions from the thin and intense plasma ignited ahead of anode electrode by plasma discharge in the strong crossed electric and magnetic fields. Besides annular ionization channel in the ion thruster, a different closed drift channel may also be used in the anode layer ion source. The linear type may use race-track channel to form a continuous and closed ionization section as shown in Advanced Energy Industries, Inc. Industrial ion sources and their application for DLC coating, mentioned in U.S. Pat. No. 20050247885 A1 by Madocks and in U.S. Pat. No. 6,984,942 B2 by Seigfried et al. These publications are incorporated herein for reference.

In a conventional end hall ion source, the circular geometry is not well suited for scaling to a large size because of the central magnetic pole and central gas feed-through configuration. Furthermore, the annular closed drift channel design is not suited for scaling to a small size because the small size for annular design has a great deal of surface area relative to the volume. Therefore, large size circular ion beams, like that of the Kaufman grid ion source, cannot be achieved conventionally with these two types of ion sources.

Some cylindrical geometry hall sources, which comprise characteristics of end hall and closed electron drift, were described in U.S. Pat. No. 20020014845 A1 issued to Raitses et al, in 2002 for small power ion thrusters and in U.S. Pat. No. 20050237000 A1 issued to Zhurin in 2005 for high efficient ion sources. These publications are also incorporated herein by reference.

SUMMARY OF THE INVENTION

In light of the foregoing, one object of the present invention is to provide an ion source with an improved configuration, and preferably with an improved magnetic circuit and magnetic fields.

Another object of the present invention is to provide an ion source, which is capable of producing an ion beam that has a large cross sectional area. A further object of the present invention is to provide an ion source that is capable of producing a magnetic mirror field between magnetic pole pieces in its discharge region. Yet another object of the present invention is to provide an ion source that has a magnetic field between its inner and outer magnetic pole pieces, which field has an axial component (e.g. along the central discharge channel) which increases in strength in the downstream direction up to the anode and decreases in strength from the anode to the open end.

Yet another object of the present invention is to provide an ion source which has inner and outer magnetic pole pieces and magnetic field lines between said inner and outer pole pieces, said field being predominantly axial near the inner magnetic pole piece and predominantly radial near the open end of the ion source's discharge region.

Another object of the present invention is to provide an ion source, which has an inner magnetic pole piece in the form of a cylindrical ring. A further object of the present invention is to provide a magnetic pole piece having permanent magnets for providing a magnetic field, said permanent magnets being protected from contamination by plasma discharge.

Another object of the present invention is to provide an ion source with high efficiency of ionization in a big discharge cross section Such highly efficient discharge may lead to a conversion of 60-90% of the discharge current into the ion beam current, compared to an end hall ion source with only about 20-25% of the discharge current converted into the ion beam current.

A further object of the present invention is to provide an ion source with wider operating conditions for discharge voltage from about 200 V to over 1000 V, and for discharge current from about 0.2 A to over 10 A.

Yet another object of the present invention is to provide a hall ion source which has big circular ion beams more than 100 mm, as a result of the contribution of the combination of the end hall and closed drift configurations.

Still another object of the present invention is to provide an ion source with robust design and low maintenance and wider range of operation parameters at variable magnetic fields. In some preferred embodiments no water-cooling is needed except for the anode. As permanent magnets are preferably placed outside the discharge chamber the discharge power may be over 5 KW. The magnetic field strength may be changed easily by simply varying the amount of permanent magnets.

In accordance with one specific embodiment of the present invention, a linear hall current ion source of the end hall type is stretched out to lengths beyond one meter along transverse direction and generates belt-like ion beams from the open strip at the end of the ion source.

At its most general one aspect of the present invention proposes that a hollow piece (e.g. a cylindrical magnetic ring piece or geometric shape with interior aperture is used as an inner magnetic pole piece of the ion source. Preferably this pole piece is positioned upstream of the outer magnetic pole piece so that the exit of the discharge region is substantially free of obstruction. At its most general another aspect proposes that the magnetic fields are generated by permanent magnets outside of the ion source and preferably sealed off from the plasma. Preferred embodiments of the present invention may provide efficient operation of a closed drift ball ion source and may achieve a large size and efficient operation of an ion source having mirror magnetic fields with substantial radial component around annular anode with a big open end, such that large circular ion beams are accelerated essentially along the axial direction.

A first aspect of the present invention provides an ion source comprising:

a discharge region having an open end and being arranged for plasma production and acceleration;

an outer magnetic pole piece arranged at said open end of said discharge region, being formed of magnetically permeable material and having an opening for allowing extraction of an ion beam;

a channel for distributing gas from a gas source to said discharge region;

an inner magnetic pole piece positioned upstream of said outer magnetic pole piece, an anode positioned upstream of said outer magnetic pole piece;

said inner and outer magnetic pole pieces having opposite magnetic orientations and being arranged to produce a magnetic mirror field between said pole pieces in said discharge region.

Usually the outer magnetic pole piece will have an inner edge surrounding its opening and said inner magnetic pole piece will be radially inward of said inner edge of the outer magnetic pole piece.

A magnetic mirror-field, as will be understood by a person skilled in the art, is a magnetic field over a volume of space, which is relatively weak at the center and strong at the ends of the space.

For example, in a cylindrical volume a magnetic mirror field is strong at the two ends of cylinder and relatively weak in the middle. This allows charged particles to be trapped in the volume as they are reflected by the strong fields at either end into the central region of the "magnetic bottle". It is advantageous to have a magnetic mirror field in the discharge region of an ion source because it facilitates retention of charged particles in the discharge region, which is necessary for plasma production. The magnetic mirror field may be annular in which case the regions of strong magnetic field are annular too, being located at the top and bottom of the annular volume defined by the annular mirror magnetic field.

"Open end" means that the discharge region preferably has an open, substantially unobstructed end, e.g. like a conventional end hall ion source and unlike a conventional close drift annular ion source which has an annular open end which is obstructed by the inner magnet. Preferably a cathode is located in or adjacent to the discharge region. Electrons from the cathode are then drawn towards the anode and into the discharge region, where they facilitate the plasma production by collision with gas molecules, which are present in or passing through the region. While it may be possible to have a separate cathode, it is preferable that the outer magnetic pole piece itself acts as a cathode, so that no separate cathode is needed. Thus, preferably said outer magnetic pole piece and/or inner magnetic pole piece act as a cathode. In one embodiment a shield and a back magnetic shunt connect the outer magnetic pole piece to the inner magnetic pole piece and together form a hollow cathode, which has a negative electrical potential relative to the anode. It may only be necessary to apply a positive electric potential to the anode, which will result in the other pieces having a negative electric potential relative to the anode, without needing to connect them to external power leads.

The ion source has an axis in the direction from its upstream end to its downstream end. Preferably said magnetic field between said inner and outer magnetic pole pieces has an axial component which (when measured along a central axis of the ion source) increases in strength in the downstream direction up to the anode and decreases in strength from the anode to the open end of the discharge region This magnetic field profile has a positive magnetic gradient upstream around the anode and a negative magnetic gradient downstream at the open end of the discharge region which will produce an electron trap in the axial direction, unlike a prior art end hall ion source with a negative magnetic gradient which induced substantial axial electron current which was lost upwards to the gas distributor (downwards to the gas distributor in the orientation shown in FIG. 1 which is described later). This resulted in low ionization efficiency in the discharge region of the prior art end hall ion source.

Preferably magnetic field lines of said magnetic field between said inner and outer magnetic pole pieces are predominantly axial at said inner magnetic pole piece and predominantly radial at said open end of said discharge region. This makes it possible to start plasma discharge with a wide voltage range, e.g. from 200 to over 1000V.

Preferably the inner magnetic pole piece is hollow. Hollows is used here to mean that the interior of the pole piece has been hollowed out so that it ha no core. This is a convenient way of providing a mirror magnetic field (in combination with the outer magnetic pole piece). It also means that the central axial field is reduced, making it possible to provide an axial magnet field along the central axis which increases in strength until the anode and decreases in strength from the anode to the open end of the discharge region.

Preferably said inner hollow magnetic pole piece has an open aperture at its upper end (i.e. the end near the outer magnetic pole piece). The open aperture joins with the hollow. This provides a desirable magnetic field and also forms a passage for allowing passage of gases through said aperture into said discharge region. For example the inner magnetic pole piece may be in the form of a cylindrical ring. In that case the opening in the outer magnetic pole piece may be approximately circular. Alternatively, the inner magnetic pole piece may be generally rectangular in shape moving with an aperture in the center, for example in the shape of a race track. In that case the outer magnetic pole piece may have a generally rectangular opening. In this way, the inner and outer magnetic pole pieces-have configurations relative to each other which are conducive to forming a desirable magnetic field between them, for example a mirror magnetic field. As the inner magnetic pole piece has a central aperture, the opening of the outer magnetic pole piece (and thus the open end of the discharge region) may be made very large. As the inner magnetic pole piece is ring shaped, or has an aperture, it is easy to enlarge it when the outer magnetic pole piece is large, so that its edges are still close to the inner edges of the outer magnetic pole piece. This ensures desirable magnetic field qualities and is in contrast to prior art designs, which had a central rod magnet which cannot be easily scaled and would not produce a mirror magnetic field.

Preferably the ion source farther comprises one or more magnets which are positioned radially outward of the inner magnetic pole piece relative to said central axis. Preferably said one or more magnets are in magnetic communication with said inner and outer magnetic pole pieces. In this way the inner and outer pole pieces need not themselves be (permanent or electromagnetic) magnets. Rather, they are pieces of magnetically permeable material which, when in contact with said magnets, act as magnetic poles. That is, the magnetic field of said one or more magnets permeates said inner and outer magnetic pole pieces causing them to have opposite magnetic orientations to each other (e.g. because they are in magnetic communication with opposite ends of the magnets). Consequently, a magnetic field arises between the inner and outer magnetic pole pieces. As the inner and outer magnetic pole pieces are not themselves magnets and the actual magnets are positioned radially outward of the inner magnetic pole piece, this arrangement gives a lot of flexibility in the design, shape and configuration of the pole pieces which would not be possible if they were themselves magnets.

Preferably said one or more magnets are permanent magnets. It is further preferable that these magnets are sealed off from the channel for distributing gas from a gas source to a discharge region. For example, the magnets may be placed in a sealed chamber which is bounded by or in magnetic communication with the inner and outer magnetic pole pieces. Sealing the magnets off from the gas distribution channel protects the magnets from contamination, which has been a problem with prior art ion sources.

In one arrangement the inner magnetic pole piece may be connected to said one or more magnets by a back magnetic shunt. The back magnetic shunt should be made of magnetically permeable material. A shield, such as a cylindrical shield (surrounding the anode and inner magnetic pole piece) may be used to seal the magnets off from said channel. The shield may advantageously be disposed between the back magnetic and to the outer magnetic pole piece.

In one preferred arrangement the inner magnetic pole piece, outer magnetic pole piece, back magnetic shunt and shield combine together to form a hollow cathode channel around the anode.

Preferably, the anode has internal passages for allowing the passage of water or oil to cool the anode during operation.

As mentioned above, the inner magnetic pole piece preferably has an open end at the discharge region. This allows the inner magnetic pole piece to be easily expanded so that its edges are close to the edges of the opening in the outer magnetic pole piece, if the ion source is of a large size it also allows gases to pass through the inner magnetic pole piece.

Preferably, the magnets are removable and replaceable. This allows that the number of magnets to be changed in order to modify the strength and other properties of the magnetic field. This is only possible if the inner and outer magnetic pole pieces are not themselves magnets and gives extra flexibility in design, which is not possible if the inner and outer magnetic pole pieces are permanent magnets.

A second aspect of the present invention provides an ion source comprising:

a discharge region having an open end and being arranged for plasma production and acceleration;

an outer magnetic pole piece arranged at said open end of said discharge region, being formed of magnetically permeable material and having an opening for allowing extraction of an ion beam;

a channel for distributing gas from a gas source to said discharge region;

an inner magnetic pole piece positioned upstream of said outer magnetic pole piece, an anode positioned upstream of said outer magnetic pole piece;

and a central axis;

said inner and outer magnetic pole pieces having opposite magnetic orientations, such that a magnetic field exists between said pieces; said magnetic field increasing in strength in the downstream direction up to the anode and decreasing in strength from the anode to the open end of the discharge region.

The central axis is in the direction from the upstream end to the downstream end (i.e. the open end) of the ion source.

A third aspect of the present invention provides an ion source comprising:

a discharge region having an open end and being arranged for plasma production and acceleration;

an outer magnetic pole piece arranged at said open end of said discharge region, being formed of magnetically permeable material and having an opening for allowing extraction of an ion beam;

a channel for distributing gas from a gas source to said discharge region;

an inner magnetic pole piece formed of magnetically permeable material and positioned upstream of said outer magnetic pole piece, an anode positioned upstream of said outer magnetic pole piece; and an external magnet located outside said channel and said discharge region and being sealed off from said channel and said discharge region but in magnetic communication with said first and second magnetic pole pieces such that said first and second magnetic pole pieces have opposite magnetic orientations and a magnetic field exists between said first and second magnetic pole pieces;

said first and second magnetic pole pieces being positioned such that said magnetic field between them crosses said discharge region.

As the magnet is external to and sealed off from said channel, it is protected from contamination. There may be several such external magnets. Preferably, the one or more external magnets are permanent magnets.

A fourth aspect of the present invention provides an ion source comprising:

a discharge region having an open end and being arranged for plasma production and acceleration;

an outer magnetic pole piece arranged at said open end of said discharge region, being formed of magnetically permeable material and having an opening for allowing extraction of an ion beam; a channel for distributing gas from a gas source to said discharge region;

an inner magnetic pole piece positioned upstream of said outer magnetic pole piece, said inner magnetic pole piece being hollow;

an anode positioned upstream of said outer magnetic pole piece;

said inner and outer magnetic pole pieces having opposite magnetic orientations such that a magnetic field exists between said pole pieces and extends across the discharge region.

Except where the context demands otherwise, the features of the above aspects may be combined with each other. For example, a magnet according to any one of the second to fourth aspects of the present invention may have any of the preferred features mentioned above with respect to the first aspect of the present invention. Except where the context demands otherwise, the ion sources of the second to fourth aspects of the present invention may be arranged to have a magnetic mirror field between their inner and outer magnetic pole pieces.

Preferably the ion sources according to the above aspects of the present invention are closed drift ion sources.

DESCRIPTION OF PRIOR ART

Figure 1:
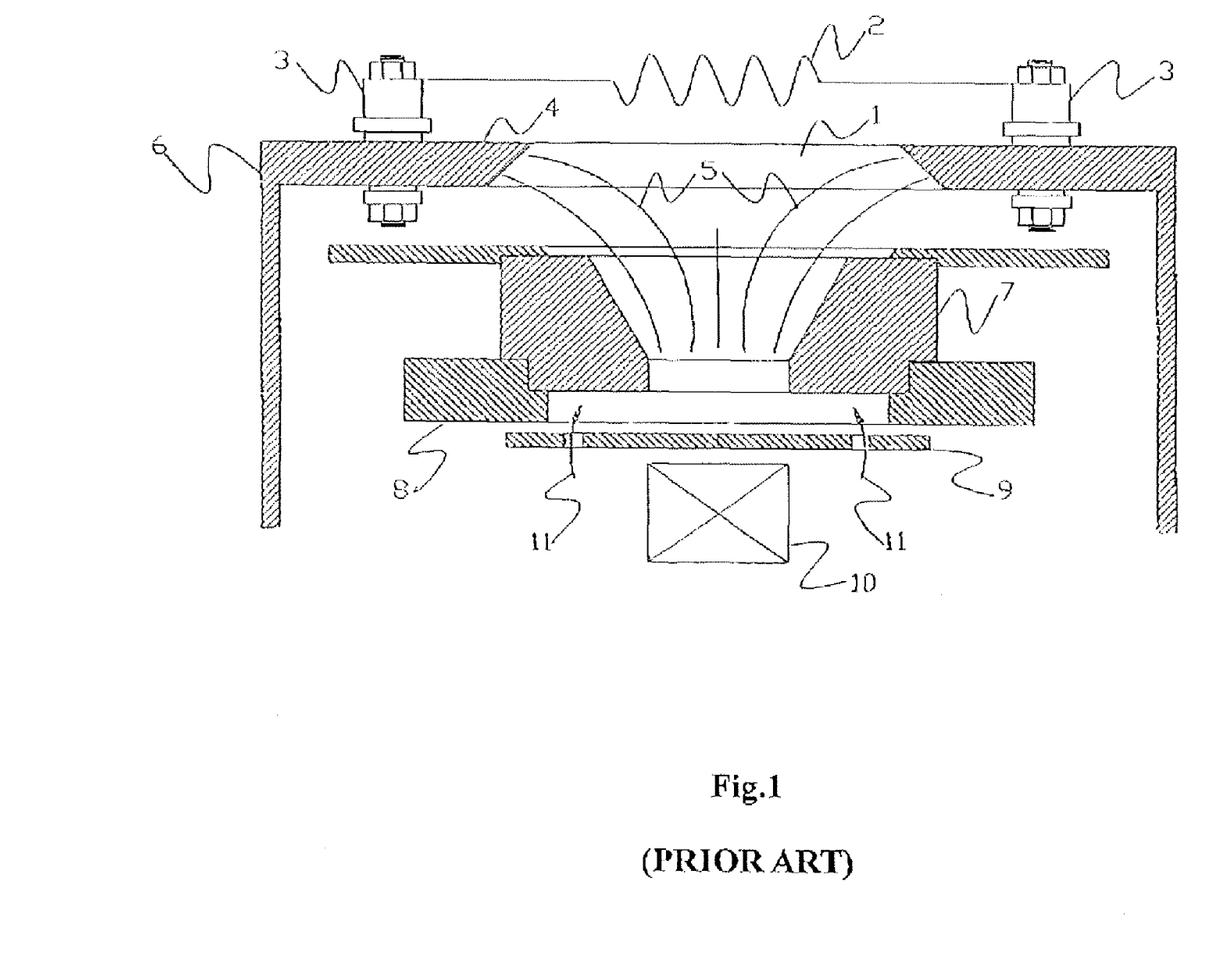
FIG. 1 is a schematic drawing representing a prior art end hall ion source

Referring to FIG. 1, there is shown a schematic representation of prior art of an end-hall ion source in U.S. Pat. No. 4,862,032 by Kaufman et al. The ion source apparatus has an open end exit 1 with circular configuration, which serves as the exit of a discharge and ion beam channel. In this end hall ion source, the magnetic field lines 5 are mostly axial at a gas distributing system, and mostly radial at the ion source exit 1 and at outer magnetic pole 4.

The end hall ion source shown in FIG. 1 includes a cathode 2, a hollow anode 7 and a magnetic field system. The magnetic field system comprises a magnetic source 10, magnetically permeable path 6 (only the upper part of ion source magnetic path is shown) and magnetic pole 4. The magnetic source 10 can be an electromagnet, or a permanent magnet, which produce a divergent magnetic profile at the head of hollow anode 7 and a negative Gradient of magnetic field distribution from a gas distributor/reflector 9 to the discharge channel exit 1.

Anode 7 is made of a non-magnetic material but of good electric conductivity. It has a hollow conical shape and is connected through a conducting plate 8 with an anode power supply (not shown). At the anode's exit, its area is substantially wider than at the place where a working gas is applied.

A hot filament (usually formed of Tungsten or Tantalum) cathode 2 is placed between two cathode supports 3 and is electrically isolated from the outer magnetic pole piece 4. Cathode supports 3 are connected by a solid insulated wiring through ion source body to a cathode power supply. A cathode wiring can also be placed outside a main body of the ion source. In many cases, a hollow cathode electron gun, instead of a hot filament emitter, is used to emit electrons for igniting plasma discharge. Although the hollow cathode is not so simple as a hot filament, it can provide higher emission current and much longer lifetime.

Working gases such as argon and other noble or reactive gases are applied to anode area through the gas distributor/reflector 9 with holes 11. The gas distributor 9 has a floating potential.

When different working gases, such as argon, oxygen and nitrogen, are fed into the discharge region, the hot filament lifetime can vary from 4 to 14 hours for typical operation parameters. A hollow cathode usually operates on noble gases such as argon for technology and xenon for space applications and can serve over 100 hours. However, when a reactive gas such as oxygen is used in the anode area, the lifetime of the hollow cathode is usually half of that with noble gases.

An ion beam is developed in the discharge region between anode 7 and filament cathode 2. Electrons from the filament cathode are used to ignite the plasma discharge, ionize the working gases, and to neutralize the resulting ions. Consequently, a strong plasma discharge and plasma flow exists between anode 7 and the ion source exit 1. The plasma flows not only in the direction of the ion source exit 1, but also in the opposite direction into a gas distributor/reflector 9. Such strong plasma flow leads to severe erosion damage of gas distributor/reflector 9, and reduces its lifetime significantly. Besides the gas distributor damage, sputtered particles fly back into a discharge channel and into a vacuum chamber area leading to contamination, etching, and deposition.

Figure 2:
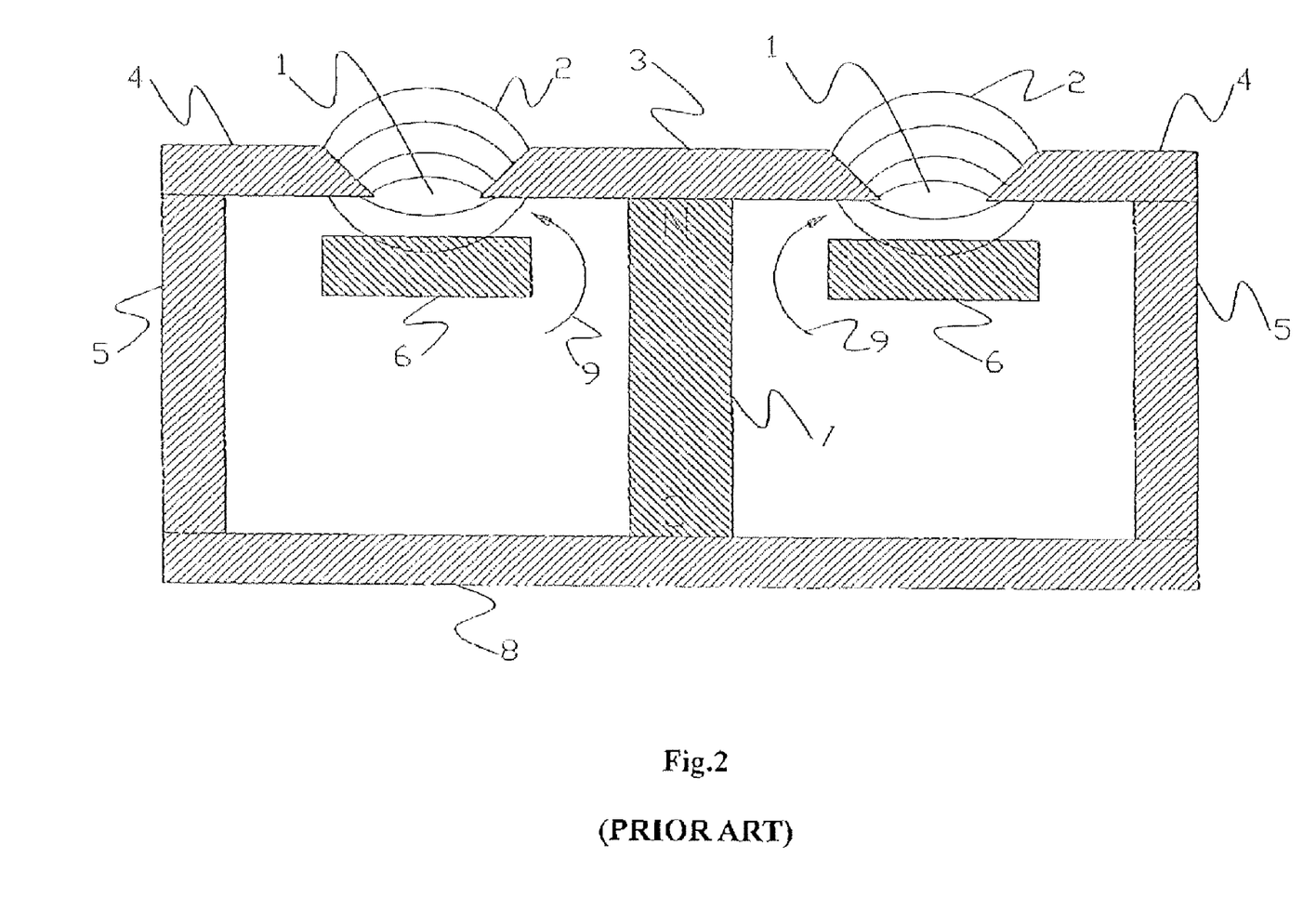
FIG. 2 is a schematic drawing representing a prior art anode layer ion source with closed drift electrons

Referring to FIG. 2, there is shown a schematic presentation of a prior art closed drift anode layer ion source used for industrial applications. The ion source apparatus mainly consists of an anode 6 and a magnetic field system, which also serves as a cathode 4. Such a prior art source can either be annular or stretched out to lengths beyond three meters. The confined hall current design enables extendibility similar to a planar magnetron. The ion source apparatus has an annular or a race-track shaped exit 1 for ion beam extraction.

The magnetic field lines 2 in the source exit 1, which is enclosed by anode 6, internal magnetic pole 3 and external magnetic pole 4, are created by permanent magnet 7, back magnetic shunt 8, magnetic path 5, internal magnetic pole 3 and external magnetic pole 4 which are connected to ground. The anode 6 is connected to a positive potential of a high voltage power supply (not shown). Therefore, crossed electric and magnetic fields in the gap between anode 6, internal magnetic pole 3 and external magnetic pole 4 are produced when discharge power is applied.

As those skilled in the prior art appreciate, the anode in a closed drift ion source is disposed a distance from the gap between the pole portions, where that distance exceeds the Larmor radius of the captured electrons. The width of the gap in source exit 1 is adjusted to maintain a magnetic field of sufficient magnetic strength to magnetize electrons and to allow plasma to exist therein. The strong magnetic field will capture free electrons and ignite avalanche ionization of working gases. Therefore plasma discharge is produced and ion beams are extracted from the crossed electric and magnetic fields.

Working gases such as argon and other noble or reactive gases are applied to the discharge area 1 from the back region 9 behind the anode 6. In many cases, anode 6 also serves as a was distributor. There is no need for an electrons source in normal operation in this prior art apparatus, except that the ion beams should be neutralized.

DESCRIPTION OF THE PREFERRED EMBODIMENTS

Figure 3:
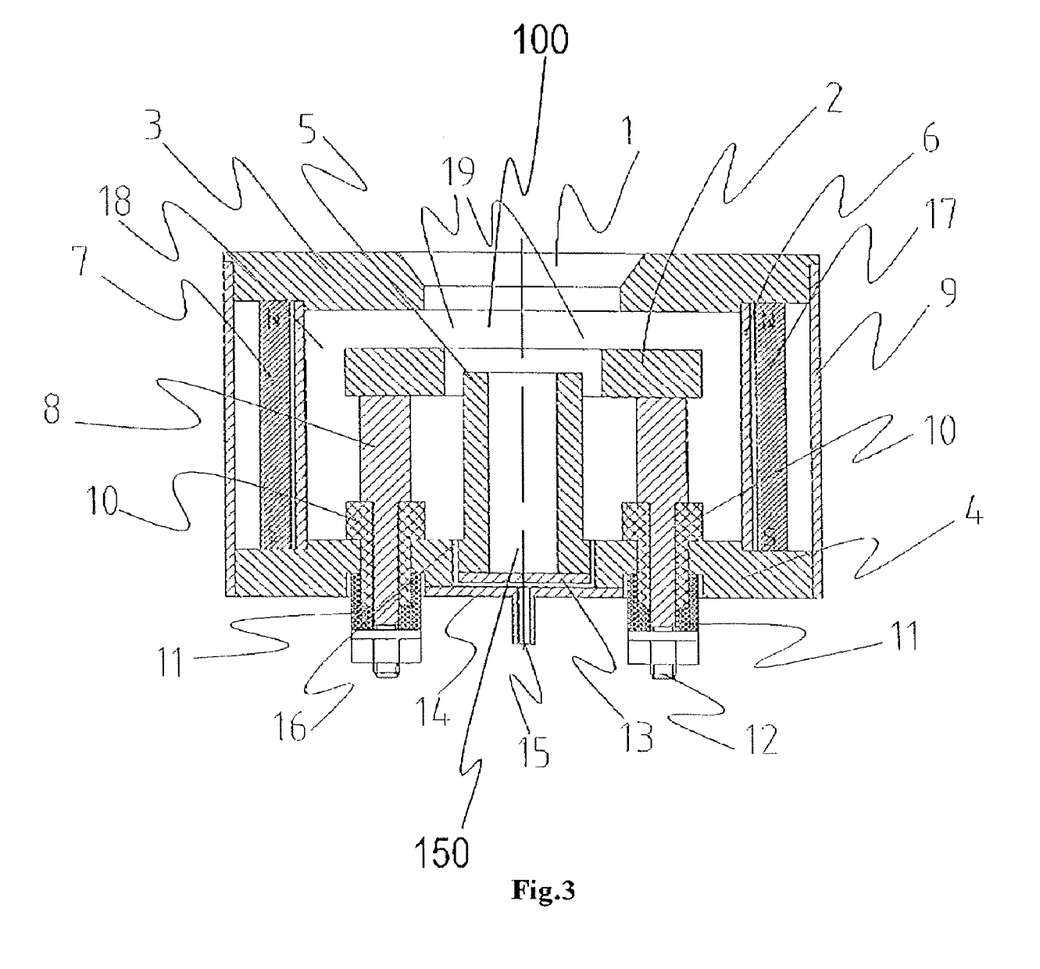
FIG. 3 is a schematic drawing of a first embodiment of the present invention, in which the ion source has a cylindrical configuration.

FIG. 3 presents a schematic drawing of a closed drift hall ion source in accordance with a first embodiment of the present invention. The ion source in this embodiment has a cylindrical configuration. It has a discharge region 100 with an open end 1, and an inner magnetic pole piece 5 which is hollow or tubular. The inner magnetic pole piece is hollow and has an open end. Preferably it is in the form of cylindrical magnetic ring 5. The discharge region may alternatively be called a discharge channel. The ion source further comprises an annular anode 2 and a cylindrical hollow cathode 18 formed by magnetic pole piece 3, back magnetic shunt 4, inner magnetic pole piece 5, and stainless steel shield 6 which are all connected to ground. The inner magnetic pole piece 5 is positioned slightly upstream of (e.g. slightly below) the upper surface of annular anode 2. Note that a hollow (e.g. annular or tubular) magnetic pole 5 is used instead of a rod magnetic pole, unlike the prior art end-hall ion source which has a central rod magnet. The inner and outer magnetic pole pieces 5, 3 are made of magnetically permeable material, but are not themselves permanent magnets or electromagnets. As can be seen in FIG. 3, the inner magnetic pole piece is radially inward of the inner edge of the exit opening 1 in the outer magnetic pole piece 3. The ion source has a central axis shown by the dotted line indicated by reference numeral 150. The central axis is in the direction from the upstream end to the downstream end (i.e. open end 1) of the ion source. In the illustrated embodiment it passes through the outer magnetic pole piece 3 and the inner magnetic pole piece 5.

The annular anode 2 is made of non-magnetic material but has good electric conductivity. It is preferably a stainless steel annular anode 2 and is inserted into the hollow space 18 inside the cathode, and is separated from magnetic pieces 3, 4, 5 and shield 6 by a distance sufficient to prevent high voltage breakdown. These distances should be selected to maintain a strong electric field at a gap 19 between the inner magnetic pole 5 and outer magnetic pole 3. There is a comparatively longer distance between the anode and back magnetic pole 4 and shield 6, in order to keep a low electric field area behind the annular anode 2. Suitable distances will be apparent to a person skilled in the art.

The annular anode 2 is supported by two or more anode supports 8, 12 and connected to an anode power supply (not shown). The anode supports 8, 12 are isolated from the back magnetic shunt 4 by inner ceramic insulator 10 and outer ceramic insulator 11. If the anode 2 is an anode with an internal cooling system, the anode supports 8, 12 also serve as the coolant inlet/outlet. Water or oil are suitable coolants.

Two or more permanent magnets 7, 17 are placed outside the hollow cathode 18 and outside the central circular discharge region 100. A strong magnetic field is introduced to the discharge gap 19 by back magnetic shunt 4, inner magnetic ring pole piece 5 and outer annular magnetic pole piece 3. An outer shield 9 is used to prevent the permanent magnets from contamination by sputtered particles from the etching processes.

The cylindrical inner magnetic ring 5 is centrally inserted as an inner magnetic pole piece upstream of the outer pole piece and anode. It also serves as a magnetic path connected to back magnetic shunt 4. Note that in this embodiment the inner magnetic pole piece 5 is a cylindrical magnetic permeability tube, not a rod magnet or permanent magnet as in a conventional end-hall ion source or closed drift ion source. As it has a ring shape with an aperture in the middle, it strengthens the magnetic field close to the annular anode 2 even if a wider ion source is used. It also sets up a mirror magnetic field with the outer magnetic pole piece, as will be described later.

The type of inner magnetic pole piece 5 used here helps to prevent severe erosion damage of the magnetic pole by plasma flow. As it is hollow it does not have a central portion which is easily damaged by plasma flow. In other embodiments, the inner magnetic pole piece 5 is not cylindrical, but is hollow, or has a central aperture, which has the same effect. The conical outer magnetic pole 3 is used herein as a discharge channel wall and a ground electrode for ion beam extraction.

The shield 6 is made of stainless steel. It is used herein to connect and support the back magnetic shunt 4 and outer magnetic pole 3. It acts as a discharge chamber shield and heat shield which seals off the external permanent magnets 7, 17 from the discharge chamber. Therefore the magnets are not influenced by hot plasma in the discharge channel.

Working gases are fed into the back area of the ion source through a channel for distributing gas from a gas source into the discharge region. In this embodiment the source of gas is a gas distributor 15 and the channel is formed by a gas inlet board 14, gas distribution board 13 and gas holes 16. The working gas is introduced at ground potential for simple operation.

Figure 4:
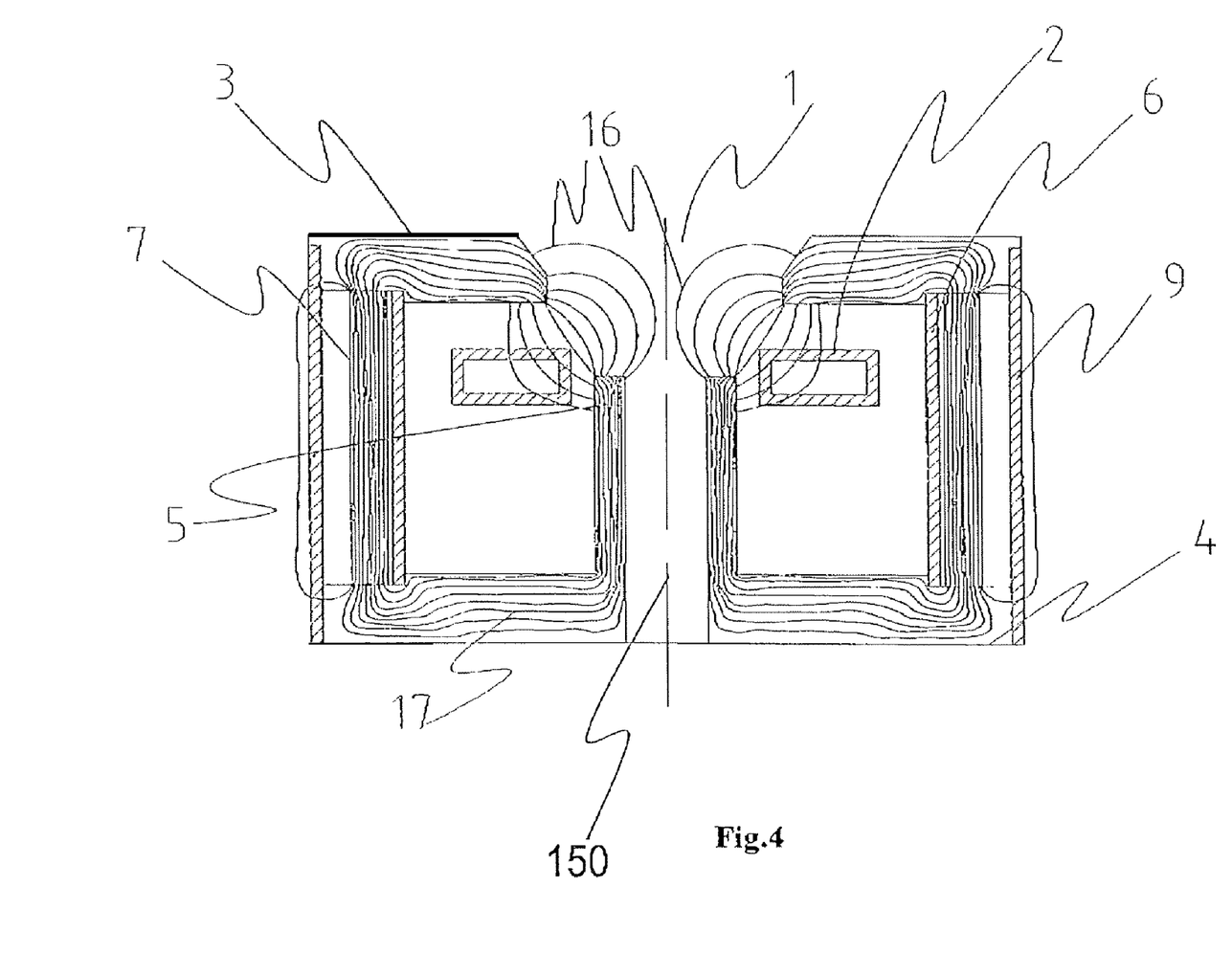
FIG. 4 is a schematic drawing showing the magnetic mirror field profile in the discharge regions and round the anode in an embodiment of the present invention.
Figure 7:
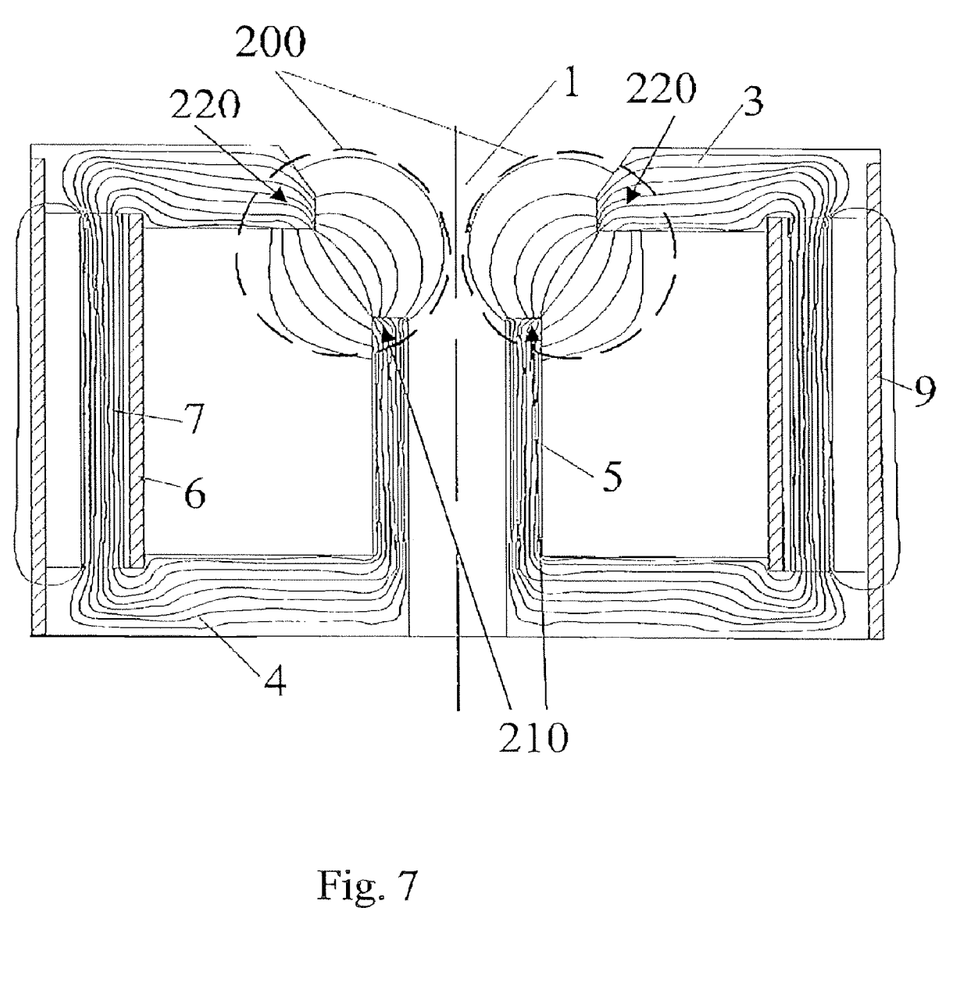
FIG. 7 shows a mirror magnetic field in more detail.

FIG. 4 presents a schematic drawing of the magnetic field profile of the ion source of FIG. 3. The closed magnetic field lines 17 start from permanent magnet 7, stretch to back magnetic shunt 4 and inner magnetic pole 5, spread into the discharge gap, and then shrink into outer magnetic pole 3 and finally back to permanent magnet 7. The magnetic field lines in the discharge gap between the inner 5 and outer 3 magnetic pole pieces form a mirror magnetic field and are denoted by reference numeral 16. The magnetic field lines 16 are mostly like a magnetic mirror field at the discharge gap, and are mostly axial at the inner magnetic pole 5 surface and mostly radial at the ion source exit 1. They are shown in more detail in FIG. 7. The magnetic mirror field region is shown in bold lines indicated by reference numeral 200. The region is annular and the upper 220 and lower 210 annular regions of high field strength are also shown in FIG. 7. It can be seen that these regions, in addition to being annular, are located above and below the ends of the outer and inner magnetic pieces respectively. As the mirror magnetic field is bounded by annular regions of high field strength relative to the lower field strength between said regions a portion of the charged particles passing through the discharge region are trapped in the mirror magnetic field. This assists ion production and helps to prevent or minimize the incidence of charged particles moving far upstream and interfering with or damaging the gas distributor 15. The symmetrical magnetic field makes electrons drift along a closed path in a circular configuration, in a manner similar to an ordinary closed drift ion source with an annular geometry.

Figure 5:
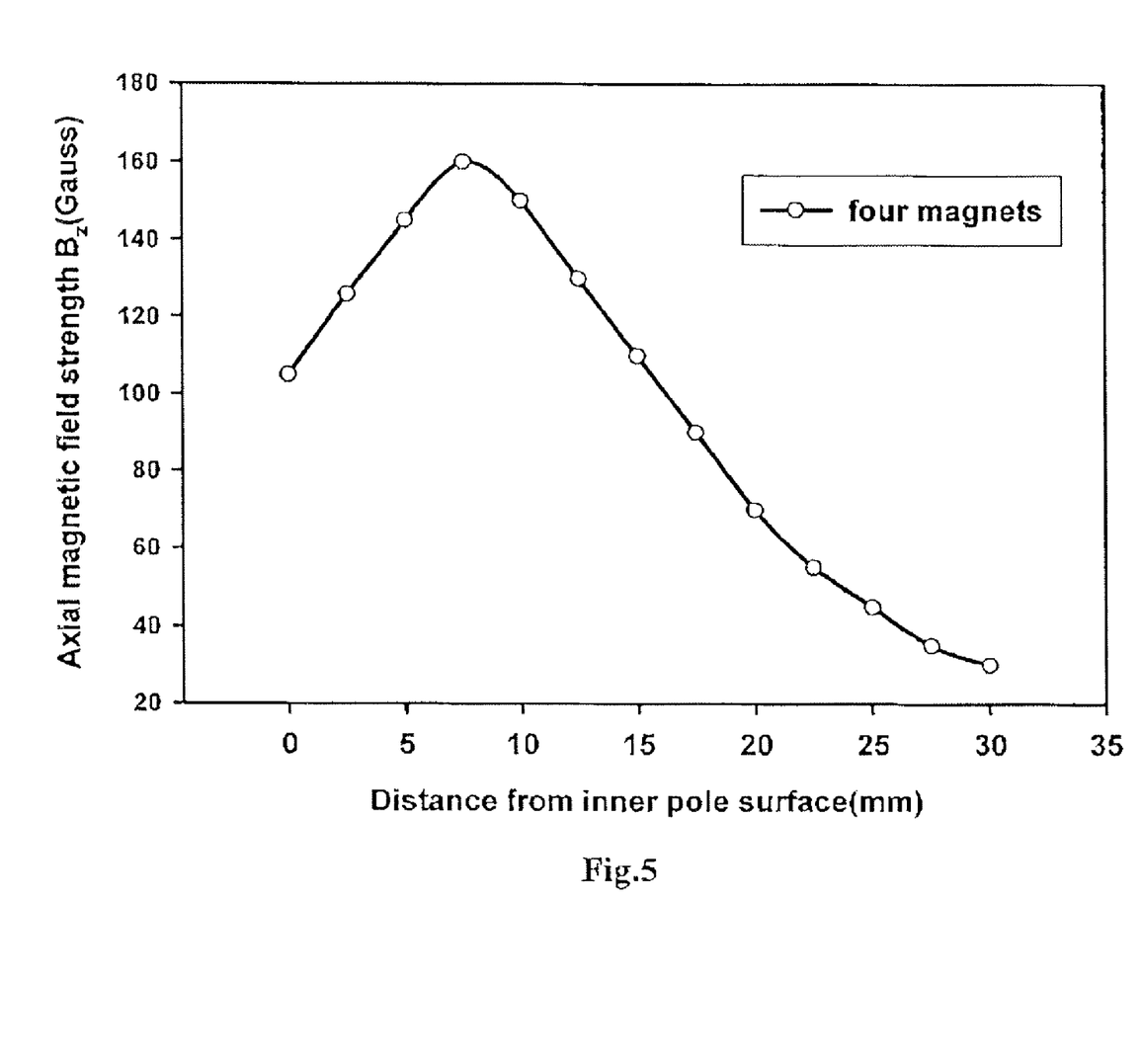
FIG. 5 is a graph showing the axial magnetic field street distribution along a discharge channel axis of an ion source according as a function of a distance from the inner magnetic pole surface.

FIG. 5 is a graph showing the axial magnetic field strength distribution along the discharge channel central axis 150 as a function of distance from the inner magnetic pole surface for the ion source of FIG. 3. The axial magnetic field will first increase downstream with the maximum value appearing several millimeters below the anode 2 and then decreasing from several hundred Gauss to several tens Gauss at the ion source exit. The presented ion source has a positive magnetic gradient upstream around the anode 2 and a negative magnetic gradient downstream at ion source exit 1, unlike a prior art end-hall ion source with only a negative magnetic gradient. The magnetic field strength and magnetic gradient can be changed by varying the amounts or strengths of the permanent magnets 7 placed in the sealed chamber between inner and outer shields 6, 9.

Figure 6:
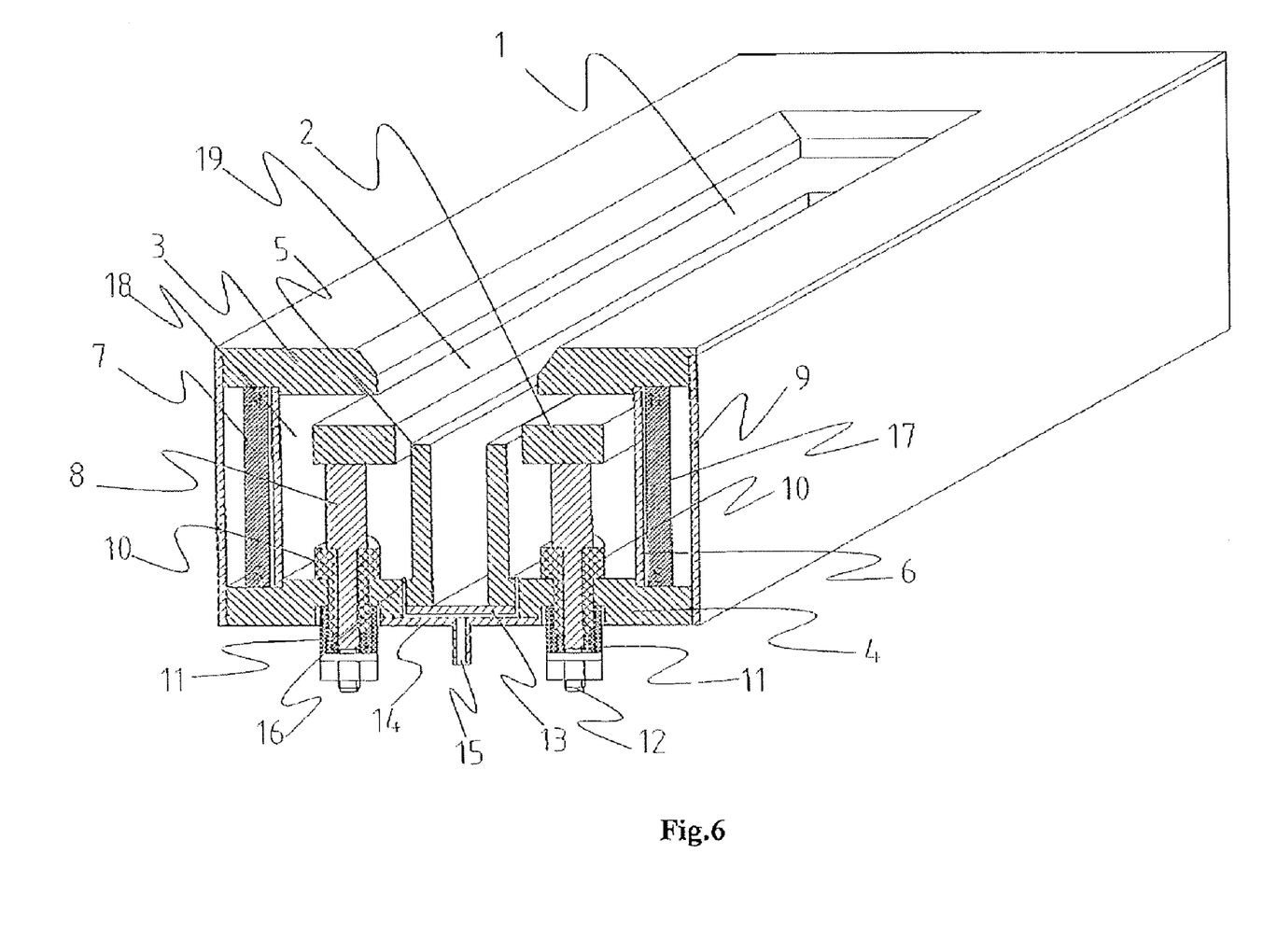
FIG. 6 is a cross section view of a second embodiment of the present invention in which the ion source has a linear configuration.

FIG. 6 presents a cross sectional view of a closed drift hall ion source according to a second embodiment of the present invention. The ion source of the second embodiment has a linear configuration and is of the end hall type (i.e. it has an open end 1 substantially free of obstructions, unlike a prior art closed drift annular configuration). The ion source is stretched out to lengths beyond one meter along the transverse direction and generates broad and wide ion beams having a generally rectangular or oval shape cross-section, from the linear open exit 1 at the end of the ion source. The ion source of the second embodiment is generally technologically similar to the cylindrical geometry hall ion source described in FIG. 3. It has a similar cross section and magnetic fields similar to those shown in FIGS. 4 and 5. The same reference numerals are used to denote the same parts as in FIG. 3. The closed path of electron drift is still kept, as in the cylindrical embodiment, but with a race-track shaped anode 2 (e.g. a substantially oval or rectangular shaped anode with a central oval or rectangular aperture), rectangular inner magnetic pole 5 and rectangular outer magnetic pole 3. Thus the inner magnetic pole is still hollow with an open end, but the hollow and open end are substantially oval or rectangular. The permanent magnets 7, 17 are placed outside discharge channel 19 and outside hollow cathode region 18, and distributed symmetrically around the rectangular shield 6. The long racetrack anode 2 is supported by several bolts 8, 12 to keep different spaces between inner magnetic pole 5, outer magnetic pole 3, back magnetic shunt 4 and shield 6, where those spaces are similar to those for the cylindrical ball ion source described in the first embodiment. The length of the linear open end of the ion source according to the second embodiment is preferably from 300 mm to over 2000 mm. The width of the ion beams is preferably over 100 mm.

While the invention has been described above with reference to certain preferred embodiments, it is to be understood that these should not be taken to limit its scope, because as will be apparent to a person skilled in the art, variations and modifications are possible while still remaining within the scope and spirit of the present invention which is defined by the appended claims.

The invention claimed is:

1. An ion source comprising:
   a discharge region having an open end and being arranged for plasma production and acceleration;
   an outer magnetic pole piece arranged at said open end of said discharge region, being formed of magnetically permeable material, and surrounding said open end to define an opening for allowing extraction of an ion beam;
   a channel for distributing a gas from a gas source to said discharge region;
   an inner magnetic pole piece positioned upstream of said outer magnetic pole piece, and thus offering no obstruction in said open end of said discharge region surrounded by said outer magnetic pole piece; and
   an anode positioned upstream of said outer magnetic pole piece;
   said inner and outer magnetic pole pieces having opposite magnetic orientations and being arranged to produce a magnetic mirror field at said open end between said pole pieces in said discharge region.

2. An ion source according to claim 1 wherein said inner magnetic pole piece is hollow.

3. An ion source according to claim 1 wherein said outer magnetic pole piece and/or said inner magnetic pole piece acts as a cathode.

4. An ion source according to claim 1 wherein said ion source has a central axis and said magnetic field in the discharge region between said inner and outer magnetic pole pieces has an axial component, said axial component of the magnetic field increasing in strength in the downstream direction up to the anode and decreasing in strength from the anode to the open end of the discharge region.

5. An ion source according to claim 1 wherein magnetic field lines of said magnetic field between said inner and outer magnetic pole pieces are predominantly axial at said inner magnetic pole piece and predominantly radial at said open end of said discharge region.

6. An ion source according to claim 2 wherein said inner magnetic pole piece has an aperture for allowing passage of gases through said aperture into said discharge region.

7. An ion source according to claim 6 wherein said inner magnetic pole piece is in the form of a cylindrical ring.

8. An ion source according to claim 6 wherein said inner magnetic pole piece is in the form of a generally rectangular shape having an aperture and wherein said opening in said outer magnetic pole piece is also generally rectangular in shape.

9. An ion source according to claim 1 further comprising one or more magnets which are positioned radially outward of the inner magnetic pole piece relative to said central axis and wherein said one or more magnets are in magnetic communication with said inner and outer magnetic pole pieces such that a magnetic field of said magnet(s) permeates said inner and outer magnetic pole pieces causing said inner and outer magnetic pole pieces to have opposite magnetic orientations and causing said magnetic field to exist between said inner and outer magnetic pole pieces.

10. An ion source according to claim 9, wherein said one or more magnets are permanent magnets.

11. An ion source according to claim 9 wherein said one or more magnets are sealed off from said channel for distributing gas from a gas source to said discharge region.

12. An ion source according to claim 10 wherein said one or more permanent magnets are sealed off from said channel for distributing gas from a gas source to said discharge region.

13. An ion source according to claim 9 wherein said inner magnet pole piece is connected to said one or more magnets via a back magnetic shunt.

14. An ion source according to claim 12 wherein a shield, for sealing the magnets off from said channel, is disposed between and connects said back magnetic shunt with said outer magnetic pole piece.

15. An ion source according to claim 13 wherein said inner magnetic pole piece, outer magnetic pole piece, back magnetic shunt and shield together form a hollow cathode.

16. An ion source according to claim 1 wherein said anode has internal passages for allowing water or oil cooling.

17. An ion source according to claim 1 wherein said inner magnetic pole piece has an open end at said discharge region.

18. An ion source according to claim 9 wherein the number of magnets is changeable in order to modify the magnetic field.

19. An ion source comprising:
- a discharge region having an open end and being arranged for plasma production and acceleration;
- an outer magnetic pole piece arranged at said open end of said discharge region, being formed of magnetically permeable material and having an opening for allowing extraction of an ion beam;
- a channel for distributing gas from a gas source to said discharge region;
- an inner magnetic pole piece positioned upstream of said outer magnetic pole piece,
- an anode positioned upstream of said outer magnetic pole piece; and
- a central axis;
- said inner and outer magnetic pole pieces having opposite magnetic orientations, such that a magnetic field exists between said pieces; said magnetic field having an axial component in the discharge region, said axial component increasing in strength in the downstream direction up to the anode and decreasing in strength from the anode to the open end of the discharge region.

20. An ion source comprising:
- a discharge region having an open end and being arranged for plasma production and acceleration;
- an outer magnetic pole piece arranged at said open end of said discharge region, being formed of magnetically permeable material and having an opening for allowing extraction of an ion beam;
- a channel for distributing gas from a gas source to said discharge region;
- an inner magnetic pole piece formed of magnetically permeable material and positioned upstream of said outer magnetic pole piece,
- an anode positioned upstream of said outer magnetic pole piece; and
- an external magnet located outside said channel and said discharge region and being sealed off from said channel and said discharge region but in magnetic communication with said first and second magnetic pole pieces such that said first and second magnetic pole pieces have opposite magnetic orientations and a magnetic field exists between said first and second magnetic pole pieces;
- said first and second magnetic pole pieces being positioned such that said magnetic field between them crosses said discharge region.

21. An ion source comprising:
- a discharge region having an open end and being arranged for plasma production and acceleration;
- an outer magnetic pole piece arranged at said open end of said discharge region, being formed of magnetically permeable material and having an opening for allowing extraction of an ion beam;
- a channel for distributing gas from a gas source to said discharge region;
- an inner magnetic pole piece positioned upstream of said outer magnetic pole piece, said inner magnetic pole piece being hollow;
- an anode positioned upstream of said outer magnetic pole piece;
- said inner and outer magnetic pole pieces having opposite magnetic orientations such that a magnetic field exists between said pole pieces and extends across the discharge region.

* * * * *